(12) United States Patent
Baker et al.

(10) Patent No.: US 10,439,627 B2
(45) Date of Patent: Oct. 8, 2019

(54) ALIAS REJECTION THROUGH CHARGE SHARING

(71) Applicant: Qualcomm Incorporated, San Diego, CA (US)

(72) Inventors: Sean Baker, San Diego, CA (US); Dinesh Jagannath Alladi, San Diego, CA (US); Balasubramanian Sivakumar, San Diego, CA (US); Kentaro Yamamoto, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/010,117

(22) Filed: Jun. 15, 2018

(65) Prior Publication Data

US 2019/0190529 A1   Jun. 20, 2019

Related U.S. Application Data

(60) Provisional application No. 62/607,309, filed on Dec. 18, 2017.

(51) Int. Cl.
*H03M 1/06* (2006.01)
*H03M 1/00* (2006.01)
*H04B 1/3827* (2015.01)

(52) U.S. Cl.
CPC ......... *H03M 1/0629* (2013.01); *H03M 1/002* (2013.01); *H04B 1/3827* (2013.01)

(58) Field of Classification Search
CPC ............................. H03M 1/0629; H03M 1/002
(Continued)

(56) References Cited

U.S. PATENT DOCUMENTS 6,744,392 B2 * 6/2004 Melanson ........... H03M 7/3006
341/118
7,432,844 B2   10/2008 Mueck et al.
(Continued)

OTHER PUBLICATIONS

Fan, et al., "High-Resolution SAR ADC with Enhanced Linearity", IEEE Transactions on Circuits and Systems—II: Express Briefs, vol. 64, No. 10, Oct. 2017, pp. 1142-1146.
(Continued)

*Primary Examiner* — Peguy Jean Pierre
(74) *Attorney, Agent, or Firm* — Colby Nipper/Qualcomm

(57) ABSTRACT

An example apparatus is disclosed for alias rejection through charge sharing. The apparatus includes a filter-sampling network, a digital-to-analog converter, and a charge-sharing switch. The filter-sampling network includes a capacitor and a first switch, which is coupled between an input node and the capacitor. The filter-sampling network is configured to connect or disconnect the capacitor to or from the input node via the first switch. The digital-to-analog converter includes a capacitor array and a second switch, which is coupled between the input node and the capacitor array. The capacitor array is coupled between the second switch and a charge-sharing node. The digital-to-analog converter is configured to connect or disconnect the capacitor array to or from the input node via the second switch. The charge-sharing switch is coupled between the charge-sharing node and the capacitor and is configured to connect or disconnect the capacitor to or from the digital-to-analog converter.

30 Claims, 11 Drawing Sheets

(58) Field of Classification Search
USPC .................. 341/118, 120, 144, 155, 163, 122
See application file for complete search history.

(56) References Cited

U.S. PATENT DOCUMENTS

| | | | |
|---|---|---|---|
| 7,812,757 | B1 | 10/2010 | Wong et al. |
| 8,547,272 | B2 | 10/2013 | Nestler et al. |
| 8,823,572 | B2 | 9/2014 | Lemkin |
| 9,054,726 | B2 * | 6/2015 | Okuda .................. H03M 1/124 |
| 2015/0381146 | A1 * | 12/2015 | Nestler .................... G06G 7/19 |
| | | | 327/551 |
| 2017/0317683 | A1 * | 11/2017 | Bandyopadhyay ... H03M 1/002 |

OTHER PUBLICATIONS

Verbruggen B., et al., "A 1.7 mW 11b 250 MS/s 2-Times Interleaved Fully Dynamic Pipelined SAR ADC in 40 nm Digital CMOS", IEEE Journal of Solid-State Circuits, vol. 47, No. 12, Dec. 2012, pp. 2880-2887.

International Search Report and Written Opinion —PCT/US2018/061647 —ISA/EPO —Apr. 10, 2019.

Joshua Kang, et al., : "A Reconfigurable FIR Filter Embedded in a 9b Successive Approximation ADC" Custom Integrated Circuits Conference,2008. CICC 2008. IEEE, IEEE, Piscataway, NJ, USA, Sep. 21, 2008 (Sep. 21, 2008), pp. 711-714, XP031361558 ISBN: 978-1-4244-2018-6, Figure 2 left-hand column, Line 1-p. 712, Line 4, Section II, Figures 1-4; Table I.

Lin D.T., et al., "A Flexible 500 MHz to 3.6 GHz Wireless Receiver with Configurable DT FIR and IIR Filter Embedded in a 7b 21 MS/S SAR ADC", IEEE Transactions on Circuits and Systems I: Regular Papers, IEEE, US, vol. 59, No. 12, Dec. 1, 2012 (2012-12-01), pp. 2846-2857, XP011482792, ISSN: 1549-8328, DOI:10.1109/TCSI.2012.2206457, p. 2850; Figures 1-6.

* cited by examiner

ALIAS REJECTION THROUGH CHARGE SHARING

CROSS-REFERENCE TO RELATED APPLICATION(S)

This application claims the benefit of U.S. Provisional Application No. 62/607,309 filed 18 Dec. 2017, the disclosure of which is hereby incorporated by reference in its entirety herein.

TECHNICAL FIELD

This disclosure relates generally to analog-to-digital conversion and, more specifically, to averaging samples within an analog-to-digital convertor to provide alias rejection.

BACKGROUND

Electronic devices use radio-frequency (RF) signals to enable users to talk with friends, download information, share pictures, remotely control household devices, receive global positioning information, or listen to radio stations. These radio-frequency signals are analog signals, which can physically travel between electronic devices and transfer digitally encoded communication data. An electronic device uses an analog-to-digital converter to convert an analog signal to a digital signal, which enables the communication data to be extracted. The analog-to-digital converter performs the conversion by sampling the analog signal at some sampling frequency. Typically the sampling frequency is greater than twice a frequency of the analog signal (e.g., according to Nyquist's rate), which enables the analog signal to be accurately represented in a digital domain.

Sometimes, however, unwanted signals in the environment, also known as jammers, are detected by the electronic device and can interfere with a desired communication signal. Examples of jammers include other, unrelated signals that exist within an operating environment and harmonics or other spurious signals that are associated with the desired communication signal. If these jammers have a frequency that is greater than or equal to half the sampling frequency of the analog-to-digital converter, the jammers can decrease a dynamic range of the electronic device and cause aliasing in the analog-to-digital converter. Aliasing occurs if the analog-to-digital converter under-samples the jammer such that a resulting digital output cannot be used to reconstruct the jammer (e.g., the sampling frequency is less than or equal to twice the frequency of the jammer). Due to aliasing, a digital representation of the jammer includes a lower frequency, which can interfere with the desired communication signal.

Some communication system designs use rejection or filter circuitry to attenuate and reject the jammer. Depending on a strength of the jammer, however, this circuitry can become large in size, require a substantial amount power, or become too expensive. Other designs may increase the sampling rate of the analog-to-digital converter to prevent aliasing. High-sampling rates, however, require additional power and can increase design complexity of the analog-to-digital converter. Overall, it becomes challenging to design an electronic device that provides alias rejection while also conserving power and efficiently using the available space in the electronic device.

SUMMARY

An apparatus is disclosed that implements alias rejection through charge sharing. The described techniques utilize multiple capacitors and switches within an analog-to-digital converter to filter and decimate an analog signal. By sharing charge across two or more capacitors, multiple samples of the analog signal are averaged. A digital output is generated based on an average sample, which provides alias rejection by attenuating high-frequency jammers. By adjusting a capacitance, the alias rejection can be tuned to attenuate a variety of different frequencies without changing a sampling rate of the analog-to-digital converter. The described techniques can conserve power by providing alias rejection without increasing an overall sampling rate of the analog-to-digital converter. Pre-existing capacitors and switches within the analog-to-digital converter can be utilized, which can further save cost and efficiently utilize space in the analog-to-digital converter. Additionally, as these techniques generally apply to a sample-and-hold phase of an analog-to-digital converter, a conversion process within the analog-to-digital converter can remain relatively unchanged.

In an example aspect, an apparatus is described. The apparatus includes an input node, a charge-sharing node, a filter-sampling network, a digital-to-analog converter, and a charge-sharing switch. The filter-sampling network includes a capacitor and a first switch. The first switch is coupled between the input node and the capacitor. The filter-sampling network is configured to connect or disconnect the capacitor to or from the input node via the first switch. The digital-to-analog converter includes a capacitor array and a second switch. The second switch is coupled between the input node and the capacitor array. The capacitor array is coupled between the second switch and the charge-sharing node. The digital-to-analog converter is configured to connect or disconnect the capacitor array to or from the input node via the second switch. The charge-sharing switch is coupled between the charge-sharing node and the capacitor. The charge-sharing switch is configured to connect or disconnect the capacitor to or from the digital-to-analog converter.

In an example aspect, an apparatus is described. The apparatus includes an input node and a charge-sharing node. The input node is configured to accept an analog signal. The apparatus also includes a filter-sampling means for collecting one or more samples of the analog signal. The filter-sampling means is coupled to the input node. The apparatus additionally includes a digital-to-analog converter. The digital-to-analog converter includes a capacitor array and a switch. The switch is coupled between the input node and the capacitor array. The capacitor array is coupled between the switch and the charge-sharing node. The digital-to-analog converter is configured to collect, via the capacitor array and the switch, another sample of the analog signal. The apparatus further includes a charge-sharing means for averaging multiple samples. The charge-sharing means is coupled between the charge-sharing node and the filter-sampling means. The charge-sharing means is configured to produce, at the charge-sharing node, an average sample of the analog signal based on the one or more samples and the other sample.

In an example aspect, a method for alias rejection through charge sharing is described. The method includes connecting a capacitor to an input node to collect a first sample of an analog signal at the input node. The method also includes connecting a capacitor array of a digital-to-analog converter to the input node to collect a second sample of the analog signal. At a charge-sharing node, the method includes connecting the capacitor to the digital-to-analog converter to produce an average voltage at the charge-sharing node. The average voltage is representative of an average of the first sample and the second sample. The method additionally includes generating a digital representation of the average voltage.

In an example aspect, an apparatus is described. The apparatus includes an input node, a charge-sharing node, a comparator, a successive approximation register, a filter-sampling network, a digital-to-analog converter, and a charge-sharing switch. The comparator includes an input and an output. The input of the comparator is coupled to the charge-sharing node. The successive approximation register is coupled to the output of the comparator. The filter-sampling network includes a capacitor and a first switch. The first switch is coupled between the input node and the capacitor. The filter-sampling network is configured to connect or disconnect the capacitor to or from the input node via the first switch based on a first sampling-phase signal. The digital-to-analog converter is coupled to the successive approximation register. The digital-to-analog converter includes a capacitor array and a second switch. The second switch is coupled between the input node and the capacitor array. The capacitor array is coupled between the second switch and the charge-sharing node. The digital-to-analog converter is configured to connect or disconnect the capacitor array to or from the input node via the second switch based on a second sampling-phase signal. The charge-sharing switch is coupled between the charge-sharing node and the capacitor. The charge-sharing switch is configured to connect or disconnect the capacitor to or from the digital-to-analog converter based on a charge-sharing phase signal.

BRIEF DESCRIPTION OF DRAWINGS

FIG. 4-1 illustrates an example implementation of a portion of a sample-and-hold circuit for alias rejection through charge sharing.

FIG. 4-2 illustrates another example implementation of another portion of a sample-and-hold circuit for alias rejection through charge sharing.

DETAILED DESCRIPTION

Electronic devices use analog-to-digital converters to support wireless communications. High-frequency jammers, however, can degrade a dynamic range of a receiver. Example jammers include other, unrelated signals that exist within an operating environment, or harmonics or other spurious signals that are associated with a desired communication signal. Some techniques use rejection or filtering circuitry to attenuate and reject the jammer. However, depending on a strength of the jammer, the circuitry can become large in size, require a substantial amount power, or become expensive. Other techniques operate an analog-to-digital converter (ADC) at high clock speeds to prevent aliasing the jammer. In general, aliasing occurs if the analog-to-digital converter under-samples an analog signal such that a resulting digital output cannot be used to reconstruct the analog signal (e.g., the resulting output includes an aliased jammer signal). However, high-sampling rates require additional power and can increase design complexity of the analog-to-digital converter.

In contrast, example approaches are described herein for alias rejection through charge sharing. The described techniques utilize multiple capacitors and switches within an analog-to-digital converter to filter and decimate an analog signal. By sharing charge across two or more capacitors, multiple samples of the analog signal are averaged. A digital output is generated based on an average sample, which provides alias rejection by attenuating high-frequency jammers. By adjusting a capacitance, the alias rejection can be tuned to attenuate a variety of different frequencies without changing a sampling rate of the analog-to-digital converter. The described techniques can conserve power by providing alias rejection without increasing an overall sampling rate of the analog-to-digital converter. Pre-existing capacitors and switches within the analog-to-digital converter can be utilized, which can further save cost and efficiently utilize space within the analog-to-digital converter. Additionally, as these techniques generally apply to a sample-and-hold phase of the analog-to-digital converter, a conversion process within the analog-to-digital converter can remain relatively unchanged.

Figure 1:
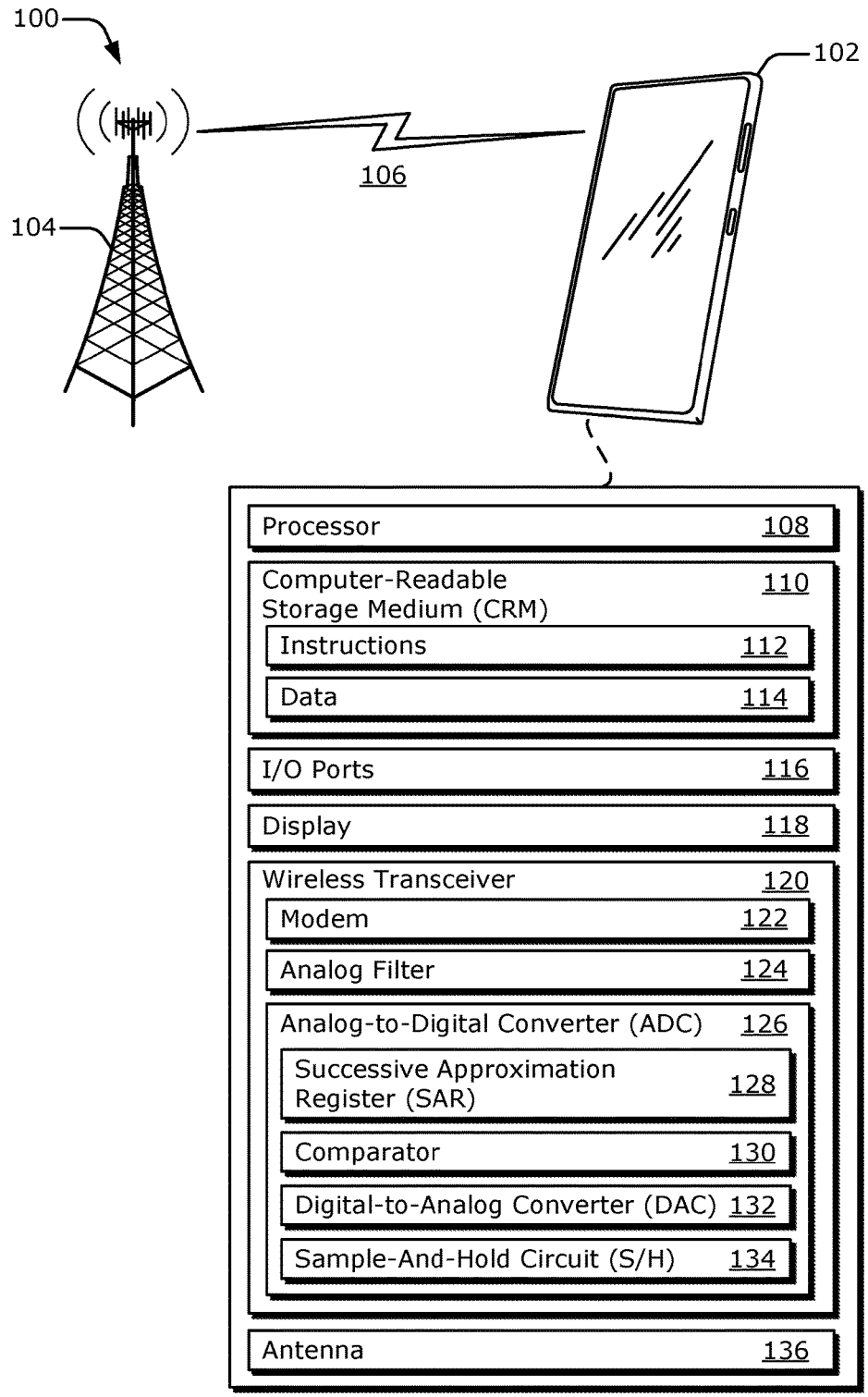
FIG. 1 illustrates an example environment for alias rejection through charge sharing.

FIG. 1 illustrates an example environment 100 for alias rejection through charge sharing. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), 5th Generation (5G), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting and receiving signals via an antenna 136. Components of the wireless transceiver 120 can include amplifiers, mixers, switches, digital-to-analog converters, filters, and so forth for conditioning communication signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains).

As shown in FIG. 1, the wireless transceiver 120 includes a modem 122, at least one analog filter 124, and at least one analog-to-digital converter 126. The modem 122, or more generally a processor, controls the wireless transceiver 120 and enables wireless communication to be performed. The modem 122 can include baseband circuitry to perform gain correction, skew correction, frequency translation, and so forth. The modem 122 can process digital signals accepted from the wireless transceiver 120 to generate data, which can be provided to the computing device 102 via a communication interface for wireless communication.

The analog filter 124 filters analog signals that are received by the wireless transceiver 120 via the antenna 136. The analog filter 124 can be implemented by a variety of different filters, including surface acoustic wave (SAW) filters, bulk acoustic wave (BAW) filters, mechanical filters, crystal filters, ceramic filters, lumped-element filters, and so forth. The analog filter 124 may be designed as a low-pass, band-pass, or high-pass filter. The analog filter 124 may also be designed to filter analog signals at radio frequencies, intermediate frequencies, or baseband frequencies.

The analog-to-digital converter 126 is coupled to the analog filter 124 and generates a digital signal based on the analog signal that is accepted from the analog filter 124. As shown in FIG. 1, the analog-to-digital converter 126 can be implemented as a successive approximation register analog-to-digital converter, which includes a successive approximation register (SAR) 128, a comparator 130, a digital-to-analog converter (DAC) 132, and a sample-and-hold circuit (S/H) 134. The sample-and-hold circuit 134 can include at least a portion of the digital-to-analog converter 132 to sample the analog signal.

An analog-to-digital conversion process generally includes a sampling phase (e.g., an acquisition phase) and a conversion phase. For the sampling phase, the sample-and-hold circuit 134 generates an average sample of the analog signal based on multiple samples. For the conversion phase, the digital-to-analog converter 132, the comparator 130, and the successive approximation register 128 jointly perform a binary search (e.g., a series of successive approximations) to generate a digital representation or approximation of the average sample. In general, the digital representation or digital output includes an N-bit binary number that is proportional to the average sample, where N represents a positive integer. The digital output can also include a discrete voltage that digitally represents the average sample. The sample-and-hold circuit 134 can at least partially implement alias rejection through charge sharing, as described in further detail with reference to FIG. 3. Because the described techniques generally correspond to the sample-and-hold circuit 134, the conversion process (e.g., operations of the comparator 130, the successive approximation register 128, and the digital-to-analog converter 132) can remain relatively unchanged.

Figure 2:
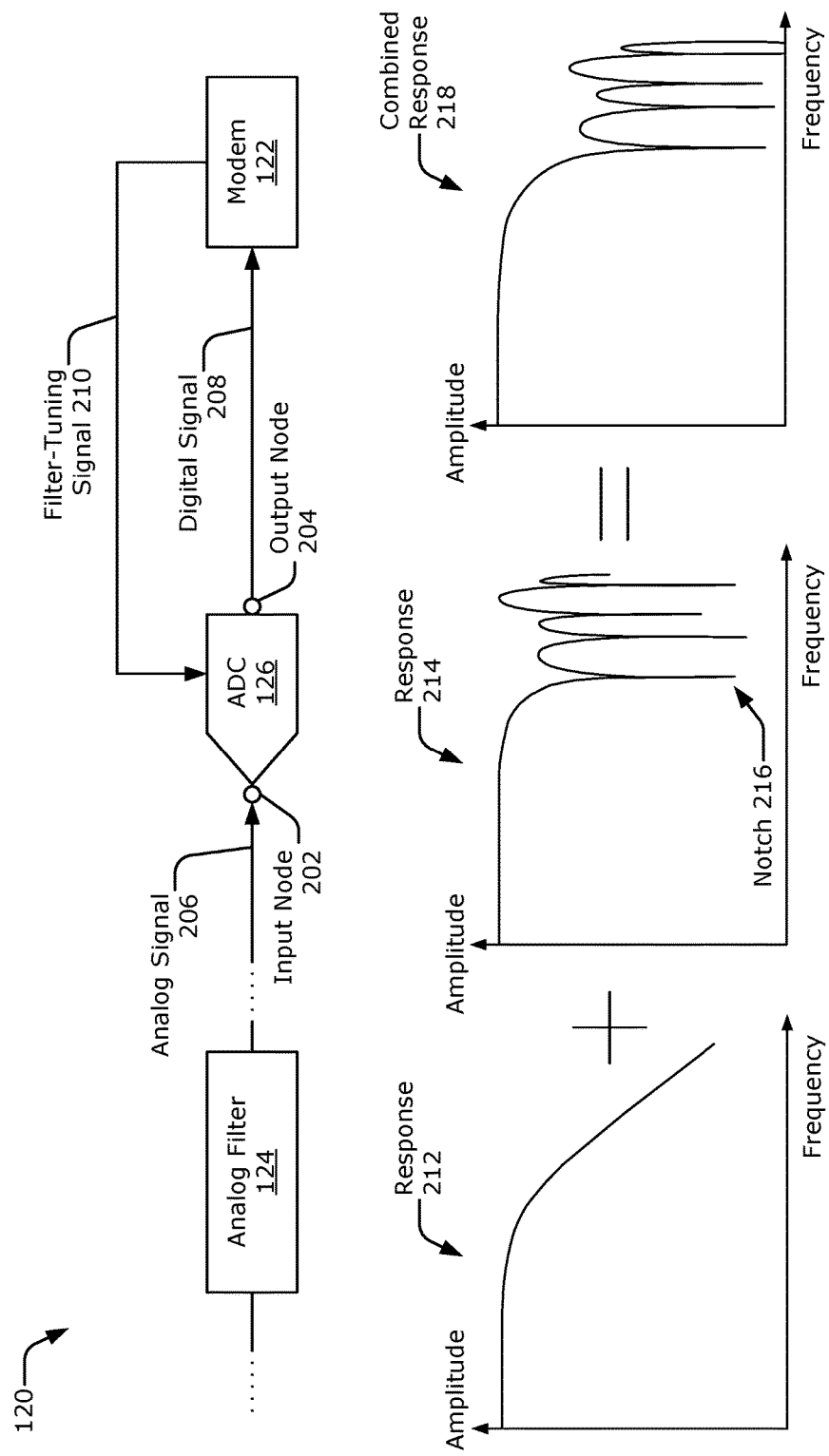
FIG. 2 illustrates an example implementation of a portion of a wireless transceiver for alias rejection through charge sharing.

FIG. 2 illustrates an example implementation of a portion of the wireless transceiver 120 for alias rejection through charge sharing. In the depicted configuration, a receiver chain of the wireless transceiver 120 includes the analog-to-digital converter 126 having an input node 202 coupled to the analog filter 124 and an output node 204 coupled to the modem 122. Via the input node 202, the analog-to-digital converter 126 accepts an analog signal 206 from the analog filter 124. The analog signal 206 can include a differential analog signal for an in-phase or quadrature channel of the wireless transceiver 120.

The analog filter 124 can generate the analog signal 206 based on a downlink signal that is received via the antenna 136. Although not shown, the analog filter 124 is coupled to the antenna 136. Other components of the wireless transceiver 120 can also be coupled between the analog filter 124 and the antenna 136, such as a low-noise amplifier or a mixer. Based on the analog signal 206, the analog-to-digital converter 126 generates a digital signal 208, which is a digital approximation of the analog signal 206. The modem 122 accepts and processes the digital signal 208 to provide communication data to the computing device 102 (not shown). The modem 122 can also generate a filter-tuning signal 210, which is provided to the analog-to-digital converter 126. The filter-tuning signal 210 initializes or sets up the analog-to-digital converter to attenuate or reject at least one jammer (e.g., at least one specified frequency).

Using the techniques of alias rejection through charge sharing, the analog-to-digital converter 126 can operate as a filter and reject or attenuate a jammer. This can enable a design of the analog filter 124 to be relaxed and conserve power in the computing device 102. In some implementations, the analog-to-digital converter 126 can obviate the use of the analog filter 124, which can be removed to save power and area in the wireless transceiver 120. In other implementations, the alias rejection capabilities of the analog-to-digital converter 126 can complement the analog filter 124 as further described with respect to a response 212 of the analog filter 124, a response 214 of the analog-to-digital converter 126, and a combined response 218 of the wireless transceiver 120 (shown in the bottom half of FIG. 2).

As shown in the illustrated response 212, the analog filter 124 is a single-pole low-pass filter. On the other hand, the response 214 of the analog-to-digital converter 126 is associated with a higher-order filter, which includes at least one notch 216. At the output node 204, the combined response 218 illustrates a superposition of the response 212 and the response 214 (e.g., the combined filtering performance of the analog filter 124 and the analog-to-digital converter 126). In comparing the combined response 218 to the response 212, the analog-to-digital converter 126 is shown to cause the amplitude of the combined response 218 to be on the order of several decibels (dB) lower (e.g., 5 dB, 10 dB, or 20 dB) than the response 212 at certain frequencies. Therefore, if the response 212 of the analog filter 124 does not provide the targeted amount of attenuation to reject a jammer, the described techniques can enable the analog-to-digital converter 126 to provide the additional amount of attenuation to prevent aliasing.

The response 214 of the analog-to-digital converter 126 is tunable and can be adjusted to attenuate different jammer frequencies or more than one jammer frequency. The modem 122, for example, can generate the filter-tuning signal 210 to adjust (e.g., increase or decrease) a frequency position of the notch 216 such that a jammer at that frequency is attenuated. This can be achieved by adjusting a quantity of samples that are averaged by the sample-and-hold circuit 134. Additionally, capacitances of the capacitors that collect the one or more of the samples can be adjusted to adjust filter coefficients (e.g., weights of different samples) and thereby the frequency position of the notch 216. As such, the average sample can be representative of a weighted average, whereby the weights or filter coefficients may be similar or different across multiple samples. Using the described techniques, the analog-to-digital converter 126 can implement a finite impulse response (FIR) filter, an infinite impulse response (IIR) filter, or generally an M-tap filter, where M represents a positive integer greater than or equal to two.

Figure 3:
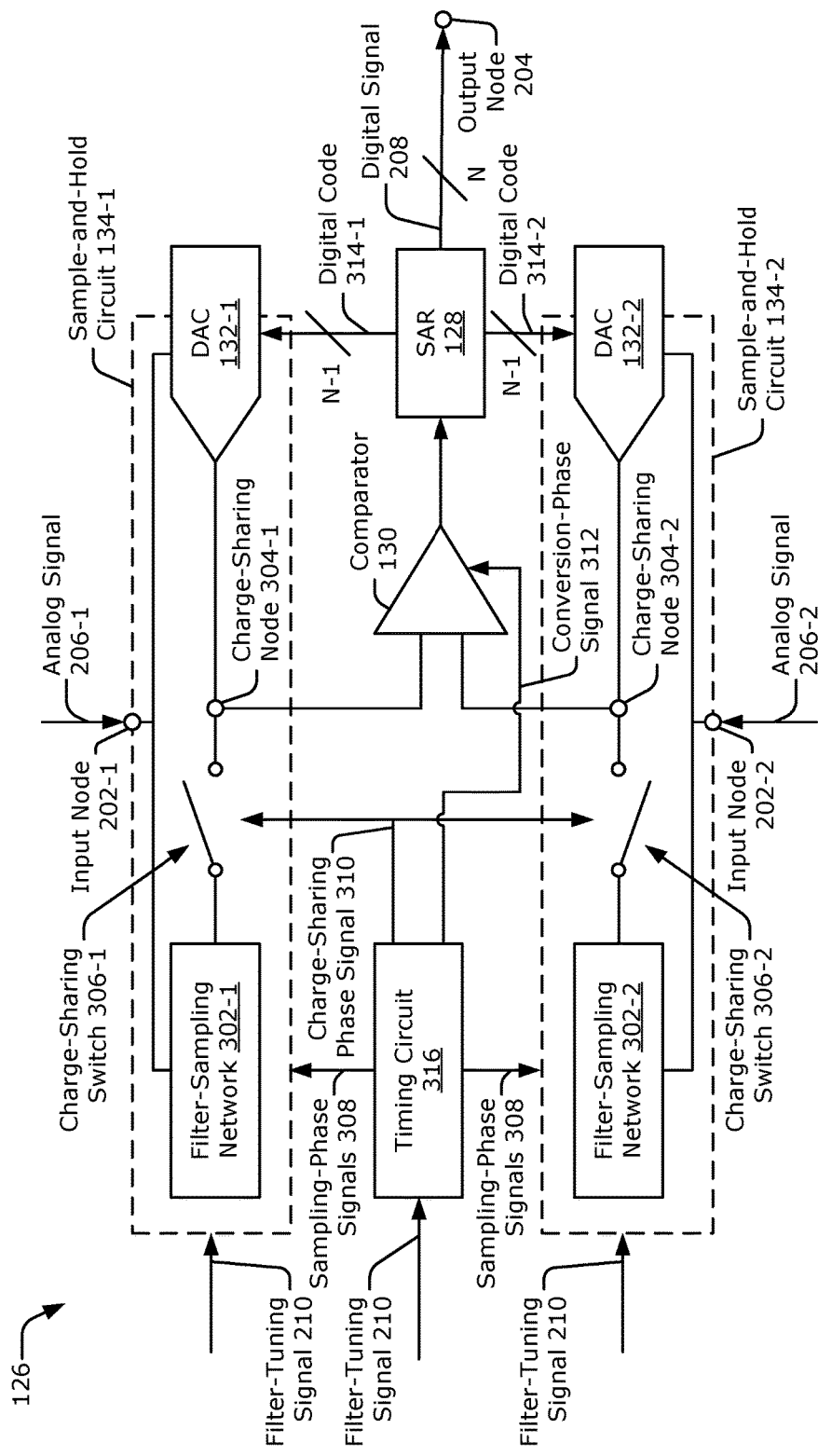
FIG. 3 illustrates an example implementation of an analog-to-digital converter for alias rejection through charge sharing.

FIG. 3 illustrates an example implementation of the analog-to-digital converter 126 for alias rejection through charge sharing. The analog-to-digital converter 126 includes two differential paths through input nodes 202-1 and 202-2, respectively. At the input nodes 202-1 and 202-2, the analog-to-digital converter 126 respectively accepts analog signals 206-1 and 206-2. The analog signals 206-1 and 206-2 are a differential pair of the analog signal 206 shown in FIG. 2. In general, the differential paths that are shown between the input nodes 202-1 and 202-2 and the comparator 130 are similar.

Sample-and-hold circuits 134-1 and 134-2 are respectively coupled to the input nodes 202-1 and 202-2. The sample-and-hold circuit 134-1 includes at least one filter-sampling network 302-1, at least a portion of a digital-to-analog converter (DAC) 132-1, a charge-sharing node 304-1, and a charge-sharing switch 306-1. The filter-sampling network 302-1 is coupled to the input node 202-1, the digital-to-analog converter 132-1 is coupled between the input node 202-1 and the charge-sharing node 304-1, and the charge-sharing switch 306-1 is coupled between the charge-sharing node 304-1 and the filter-sampling network 302-1. Likewise, the sample-and-hold circuit 134-2 includes at least one filter-sampling network 302-2, at least a portion of a digital-to-analog converter (DAC) 132-2, a charge-sharing node 304-2, and a charge-sharing switch 306-2. The filter-sampling network 302-2 is coupled to the input node 202-2, the digital-to-analog converter 132-2 is coupled between the input node 202-2 and the charge-sharing node 304-2, and the charge-sharing switch 306-2 is coupled between the charge-sharing node 304-2 and the filter-sampling network 302-2.

Figures 1, 4:
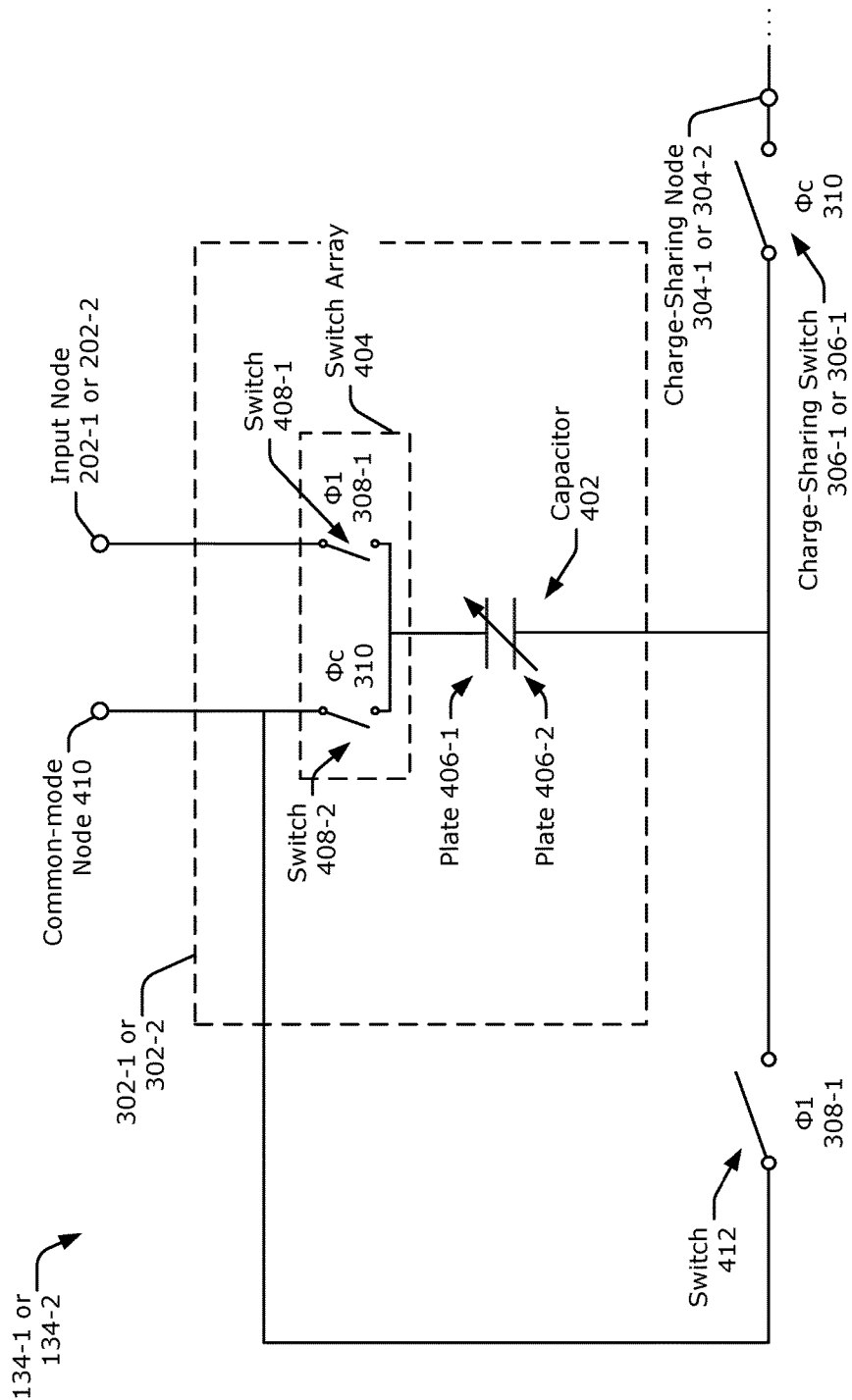
Figures 2, 4:
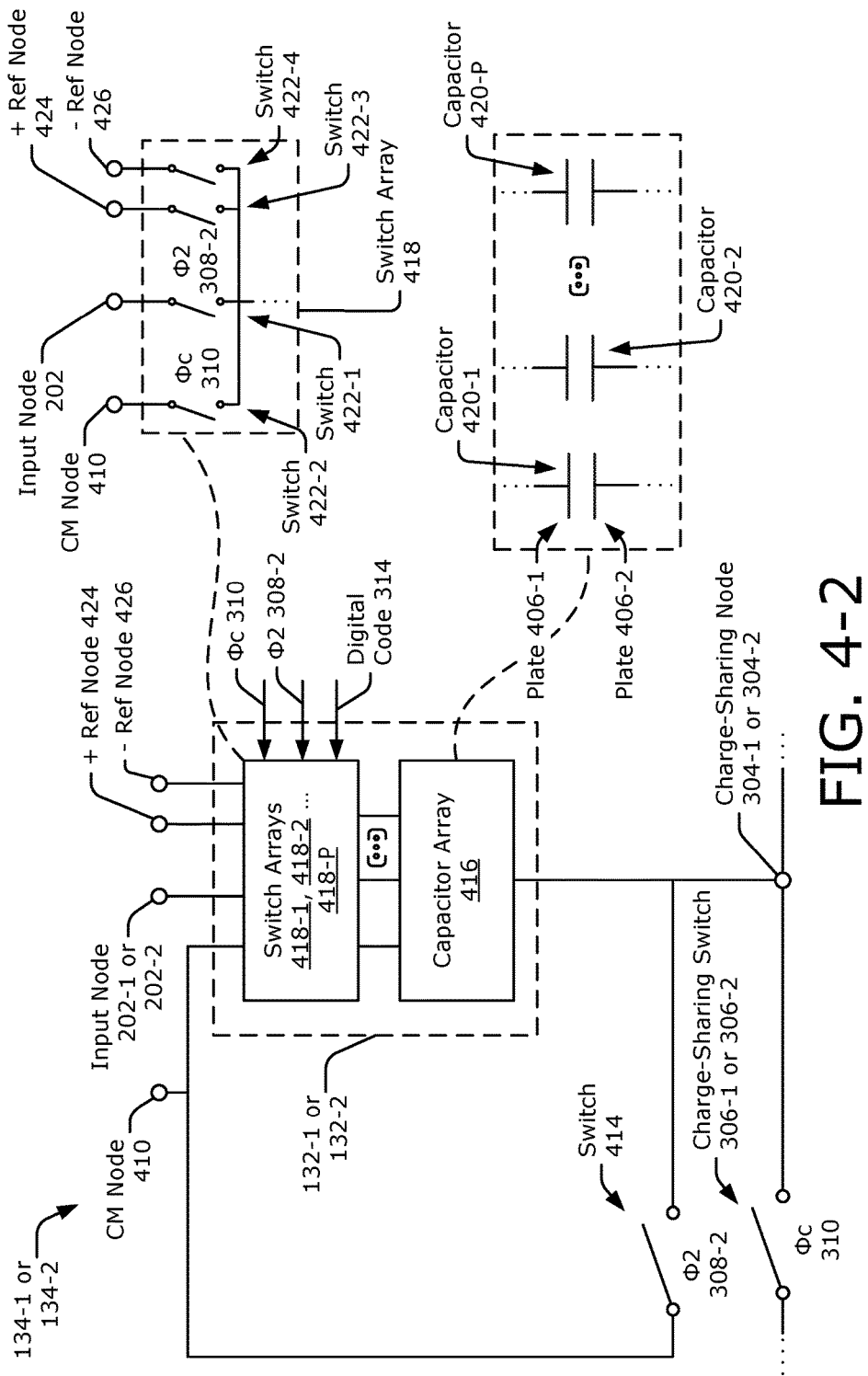

The filter-sampling networks 302-1 and 302-2 and the digital-to-analog converters 132-1 and 132-2 both include a network of switches and capacitors, which are further described with respect to FIGS. 4-1 and 4-2. In this example, the digital-to-analog converters 132-1 and 132-2 are implemented as N−1 bit digital-to-analog converters. For explanation purposes, the filter-sampling networks 302-1 and 302-2 and the digital-to-analog converters 132-1 and 132-2 are shown as discrete components for each of the differential paths. However, it is to be understood that a single filter-sampling network 302 and a single digital-to-analog converter 132 whereby each have different portions respectively coupled to the different differential paths can be implemented. In some implementations, capacitors within the filter-sampling network 302 or the digital-to-analog converter 132 can be dynamically allocated to either of the differential paths (e.g., some of the capacitors can be coupled to the input node 202-1 or the input node 202-2 based on the filter-tuning signal 210).

At the charge-sharing nodes 304-1 and 304-2, the sample-and-hold circuits 134-1 and 134-2 are respectively coupled to inputs of the comparator 130. The analog-to-digital converter 126 also includes a timing circuit 316, which is coupled to the sample-and-hold circuits 134-1 and 134-2 and the comparator 130. An output of the comparator 130 is coupled to the successive approximation register (SAR) 128. The successive approximation register 128 is also coupled to the output node 204 of the analog-to-digital converter 126 and to the digital-to-analog-converters 132-1 and 132-2.

Figure 5:
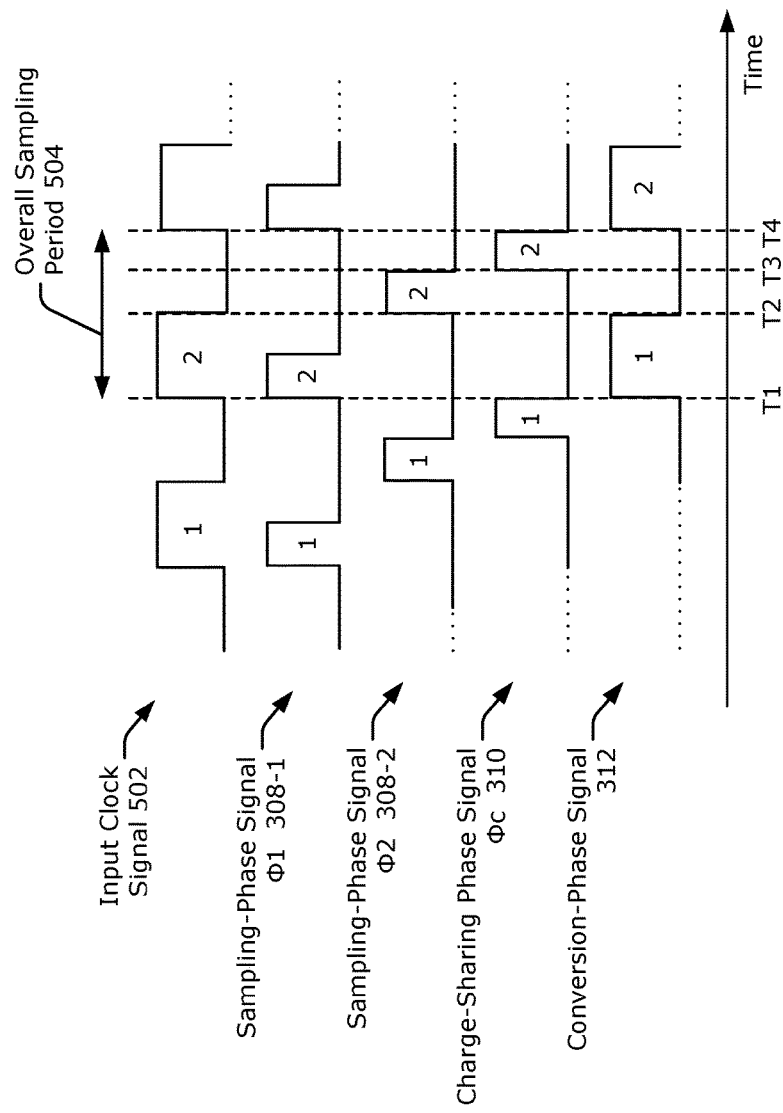
FIG. 5 illustrates a set of example timing signals for alias rejection through charge sharing.
Figure 7:
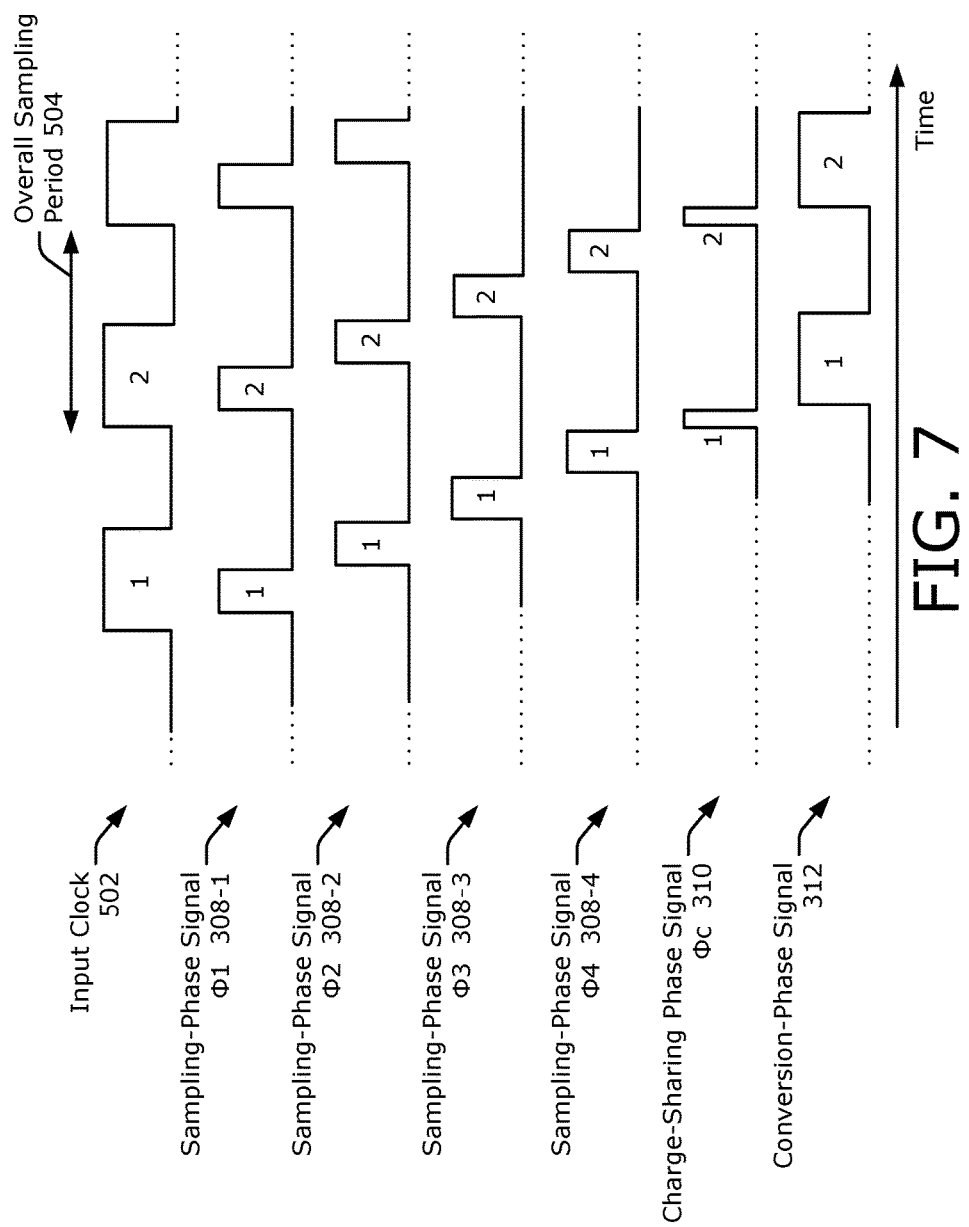
FIG. 7 illustrates another set of example timing signals for alias rejection through charge sharing.

Operations of the analog-to-digital converter 126 include sampling the analog signal 206, sharing charge to produce average samples of the analog signal 206 at the charge-sharing nodes 304-1 and 304-2, and converting the average samples to produce the digital signal 208. Timing of these operations is performed according to an input clock signal, which is shown in FIGS. 5 and 7. The input clock signal specifies an overall sampling frequency or sampling period of the analog-to-digital converter 126. At the end of each sampling period, the analog-to-digital converter 126 digitally represents the average voltage at the charge-sharing nodes 304-1 and 304-2.

The timing of the analog-to-digital conversion process is based on at least two sampling-phase signals 308, at least one charge-sharing phase signal 310, and at least one conversion-phase signal 312, which are generated by the timing circuit 316. The sampling-phase signals 308 cause the sample-and-hold circuits 134-1 and 134-2 to collect multiple samples of the analog signal 206 within the overall sampling period of the analog-to-digital converter 126. The charge-sharing phase signal 310 and the conversion-phase signal 312 respectively cause one charge-sharing operation and one conversion operation to occur within the overall sampling period of the analog-to-digital converter 126. In general, these operations apply to both of the differential paths. For clarity, however, the operations are described below without referring to a particular differential path, but the description can be applied to either or both of the differential paths.

Based on the sampling-phase signals 308, the sample-and-hold circuit 134 collects at least two samples of the analog signal 206 using the filter-sampling network 302 and the digital-to-analog converter 132. For example, a first sampling-phase signal 308 can cause the filter-sampling network 302 to store a first sample of the analog signal 206 at a first time and a second sampling-phase signal 308 can cause the digital-to-analog converter 132 to store a second sample of the analog signal 206 at a second time. In some implementations, the sample-and-hold circuit 134 can store more than two samples of the analog signal 206 using multiple filter-sampling networks 302 or using the digital-to-analog converter 132, as described with respect to FIG. 6. During a time duration that the samples are collected, the charge-sharing switch 306 is open, thereby disconnecting the filter-sampling network 302 from the charge-sharing node 304.

After the samples are collected, the charge-sharing phase signal 310 causes the charge-sharing switch 306 to close, thereby connecting the filter-sampling network 302 to the digital-to-analog converter 132. While the charge-sharing switch 306 is closed, charge is shared between the filter-sampling network 302 and the digital-to-analog converter 132 at the charge-sharing node 304. Due to the charge sharing, an average sample of the analog signal 206 is represented at the charge-sharing node 304 by an average voltage. In this example, the average sample is representative of an average of the first sample and the second sample. As described above, the average sample can be based on a weighted average. The charge sharing performs a decimation process whereby the multiple samples that are collected by the sample-and-hold circuit 134 are reduced to a single sample (e.g., the average sample).

After the charge sharing occurs, the charge-sharing switch 306 opens and the conversion-phase signal 312 causes the comparator 130, the successive approximation register 128, and the digital-to-analog converter 132 to jointly perform a binary search based on the average sample provided at the charge-sharing nodes 304. For example, the comparator 130 compares the average sample provided at the charge-sharing node 304-1 and 304-2. Based on the comparison, the successive-approximation register 128 produces digital codes 314-1 and 314-2 (e.g., N−1 bit digital signals), which causes the digital-to-analog converters 132-1 and 132-2 to adjust respective voltages at the charge-sharing nodes 304-1 and 304-2 by a fraction of a reference voltage. Each comparison operation enables the successive approximation register 128 to determine one of the bits (e.g., a most-significant bit, a middle bit, or a least-significant bit) of the binary number that digitally approximates the average sample. Upon completion of the conversion, the successive approximation register 128 provides the N-bits that represent one sample of the digital signal 208 to the output node 204. The process can continue as described above to produce multiple samples of the digital signal 208.

In general, the conversion operation (e.g., logic associated with the successive-approximation register 128) remains relatively unchanged due to the charge sharing. This is because the conversion still happens at the overall sampling frequency of the analog-to-digital converter 126. The charge sharing causes the charge-sharing node 304 to provide a single average sample to the comparator 130 instead of the multiple individual samples collected by the sample-and-hold circuit 134. Although the sample-and-hold circuit 134 samples the analog signal 206 at a higher sampling rate, the sample-and-hold circuit 134 stores the samples using passive components. As such, power consumption of the analog-to-digital converter 126 can remain relatively unchanged (e.g., the sampling rate of the sample-and-hold circuit 134 does not significantly impact power consumption of the analog-to-digital converter 126). As a result, these techniques enable the analog-to-digital converter 126 to provide alias rejection using less power than a conventional analog-to-digital converter that operates at a higher overall sampling frequency.

The use of the filter-sampling network 302 also enables the sample-and-hold circuit 134 to store at least one sample during a portion of time that the conversion phase occurs. During the conversion phase, the filter-sampling network 302 is disconnected from the charge-sharing node 304 via the charge-sharing switch 306. As such, the filter-sampling network 302 can store a next sample while the digital-to-analog converter 132 and the charge-sharing node 304 are used to perform the binary search. In this way, the described techniques enable efficient use of the overall sampling period and enable additional samples to be stored while keeping the overall sampling period of the analog-to-digital converter 126 relatively unchanged.

In some implementations, the filter-sampling network 302 is implemented using auxiliary capacitors that already exist within the analog-to-digital converter 126. These auxiliary capacitors may be used, for example, to generate a reference voltage for the binary search based on a supply voltage (e.g., scale the supply voltage). Utilizing pre-existing capacitors can save area and cost of the analog-to-digital converter 126. Different portions of the sample-and-hold circuit 134 shown in FIG. 3 are further described with respect to FIGS. 4-1 and 4-2.

FIG. 4-1 illustrates an example implementation of a portion of the sample-and-hold circuit 134 for alias rejection through charge sharing. In the depicted portion, the sample-and-hold circuit 134 includes the filter-sampling network 302-1 or 302-2, the charge-sharing node 304-1 or 304-2, the charge-sharing switch 306-1 or 306-2, and a switch 412. The filter-sampling network 302 includes at least one capacitor 402 and a switch array 404. The capacitor 402 includes a plate 406-1, which is coupled to the switch array 404, and another plate 406-2, which is coupled to the charge-sharing switch 306. In some cases, the capacitor 402 is implemented as a programmable capacitor, which can have a capacitance that is adjustable via the filter-tuning signal 210. In the depicted configuration, the switch array 404 includes a first switch 408-1 and a second switch 408-2, which are respectively coupled to the input node 202 and a common-mode node 410. A common-mode voltage is provided at the common-mode node 410. The first switch 408-1 is controlled via a first sampling-phase signal ($\phi1$) 308-1 and the second switch 408-2 is controlled via the charge-sharing phase ($\phi c$) signal 310. The switch 412 is coupled between the plate 406-2 of the capacitor 402 and the common-mode node 410. A state of the switch 412 is controlled by the first sampling-phase signal 308-1.

The filter-sampling network 302 connects or disconnects the capacitor 402 to or from the input node 202 via the switch 408-1. To sample the analog signal 206 using the capacitor 402, the plate 406-1 of the capacitor 402 is connected to the input node 202 via the switch 408-1 and the plate 406-2 of the capacitor 402 is connected to the common-mode node 410 via the switch 412. To hold the sample, the switches 408-1 and 412 disconnect the capacitor 402 from the input node 202 and the common-mode node 410, respectively. The sample is held by the capacitor 402 until the charge-sharing phase signal 310 causes the charge-sharing switch 306 and the switch 408-2 to connect the capacitor 402 to the charge-sharing node 304 and the common-mode node 410, respectively. Accordingly, this causes the charge on the capacitor 402 to be shared with the digital-to-analog converter 132, which is further described with respect to FIG. 4-2.

FIG. 4-2 illustrates an example implementation of another portion of the sample-and-hold circuit 134 for alias rejection through charge sharing. In the depicted portion, the sample-and-hold circuit 134 includes the digital-to-analog converter 132-1 or 132-2, the charge-sharing node 304-1 or 304-2, the charge-sharing switch 306-1 or 306-2, and a switch 414. The digital-to-analog converter 132 includes a capacitor array 416 and multiple switch arrays 418-1, 418-2 . . . 418-P, where P represents a positive integer. The capacitor array 416 includes multiple capacitors 420-1, 420-2 . . . 420-P. Each of the multiple capacitors 420-1, 420-2 . . . 420-P is connected to a different switch array 418-1, 418-2 . . . 420-P. To implement an N−1 bit digital-to-analog converter 132, the digital-to-analog converter 132 includes $2^{N-2}$ capacitors 420 in the capacitor array 416 and $2^{N-2}$ switch arrays 418. Each capacitor 420 includes a plate 406-1, which is coupled to the respective switch array 418, and a plate 406-2, which is coupled to the charge-sharing node 304.

The switch array 418 includes a first switch 422-1, which is coupled between the plate 406-1 of the capacitor 420 and the input node 202. A state of the first switch 422-1 is controlled by a second sampling-phase signal (φ2) 308-2. The second sampling-phase signal 308-2 differs from the first sampling-phase signal 308-1 of FIG. 4-1, thereby enabling the digital-to-analog converter 132 to sample the analog signal at a different time than the filter-sampling network 302. The switch array 418 also includes a second switch 422-2, a third switch 422-3, and a fourth switch 422-4, which are respectively coupled to the common-mode (CM) node 410, a positive (+) reference node 424, and a negative (−) reference node 426. A state of the second switch 422-2 is controlled by the charge-sharing phase signal 310. Different reference voltages are provided at the positive reference node 424 and the negative reference node 426, which enable the capacitors 420 to be used during the binary search for either of the differential paths of FIG. 3. States of the third switch 422-3 and the fourth switch 422-4 are controlled by the digital code 314 that is produced by the successive approximation register 128. The switch 414 is coupled between the plates 406-2 of the capacitors 420 within the capacitor array 416 and the common-mode node 410. A state of the switch 414 is controlled by the second sampling-phase signal 308-2.

The digital-to-analog converter 132 connects or disconnects the capacitor array 416 to or from the input node 202. To sample the analog signal 206 using the capacitor array 416, respective first switches 422-1 of the multiple switch arrays 418 connect respective plates 406-1 of the multiple capacitors 420 in the capacitor array 416 to the input node 202. Additionally, the switch 414 connects respective plates 406-2 of the multiple capacitors 420 to the common-mode (CM) node 410. To hold the sample, the respective first switches 422-1 and the switch 414 disconnect the capacitor array 416 from the input node 202 and the common-mode node 410, respectively. The sample is held by the capacitor array 416 until the charge-sharing switch 306 and the respective second switches 422-2 connect the capacitor array 416 to the filter-sampling network 302 and the common-mode node 410, respectively.

In FIGS. 4-1 and 4-2, the plates 406-1 and 406-2 can respectively refer to bottom plates and top plates such that bottom-plate sampling is performed on the capacitor 402 and the capacitors 420 of the capacitor array 416. Alternatively, the plates 406-1 and 406-2 can respectively refer to top plates and bottom plates such that top-plate sampling is performed on the capacitor 402 and the capacitors 420 of the capacitor array 416. Example sampling-phase signals 308 and charge-sharing signal 310 that are shown in FIGS. 4-1 and 4-2 are further described with respect to FIG. 5.

FIG. 5 illustrates a set of example timing signals for alias rejection through charge sharing. According to an input clock signal 502, the sampling, charge-sharing, and conversion operations of the analog-to-digital converter 126 occur within an overall sampling period 504. During the overall sampling period 504, multiple samples of the analog signal 206 are stored via the sample-and-hold circuit 134 while a previous sample is converted. Two analog-to-digital conversion operations are identified in FIG. 5 via a "1" or a "2" identifier. In FIG. 5, a high value of the sampling-phase signals 308 and the charge-sharing phase signal 310 is indicative of sampling or charge-sharing being performed, respectively (e.g., a closed-state of a switch). A high value of the conversion-phase signal 312 is indicative of the binary search being performed.

At time T1, sampling begins for the second analog-to-digital conversion operation while the binary search is performed for the first analog-to-digital conversion operation using a set of samples that were stored and shared prior to time T1. The first sampling-phase signal 308-1 causes a first voltage of the analog signal 206 to be sampled using the capacitor 402. This voltage is representative of a first sample of the analog signal 206.

At time T2, the second sampling-phase signal 308-2 causes the digital-to-analog converter 132 to connect the capacitor array 416 to the input node 202. As a result, a second voltage of the analog signal 206 is sampled using the capacitor array 416. This voltage is representative of a second sample of the analog signal 206.

At time T3, the charge-sharing phase signal 310 causes the charge-sharing switch 306 to connect the capacitor 402 of the filter-sampling network 302 to the capacitor array 416 of the digital-to-analog converter 132 at the charge-sharing node 304. In this way, the charges on the capacitor 402 and the capacitor array 416 are shared, which causes a voltage at the charge-sharing node 304 to be representative of an average sample of the analog signal 206 (e.g., an average of the first sample and the second sample).

At time T4, the conversion-phase signal 312 causes the analog-to-digital converter 126 to perform a binary search that approximates the average voltage at the charge-sharing node 304. Because the binary search is performed using an average sample instead of a single sample (e.g., the first sample or the second sample), higher-frequency jammers are attenuated, as further described with respect to FIG. 9.

In some implementations, the sample-and-hold circuit 134 can include multiple filter-sampling networks 302 or the digital-to-analog converter 132 can include multiple capacitor arrays 416. These additional components enable additional samples of the analog signal 206 to be collected and averaged, as described in further detail with respect to FIGS. 6 and 7.

Figure 6:
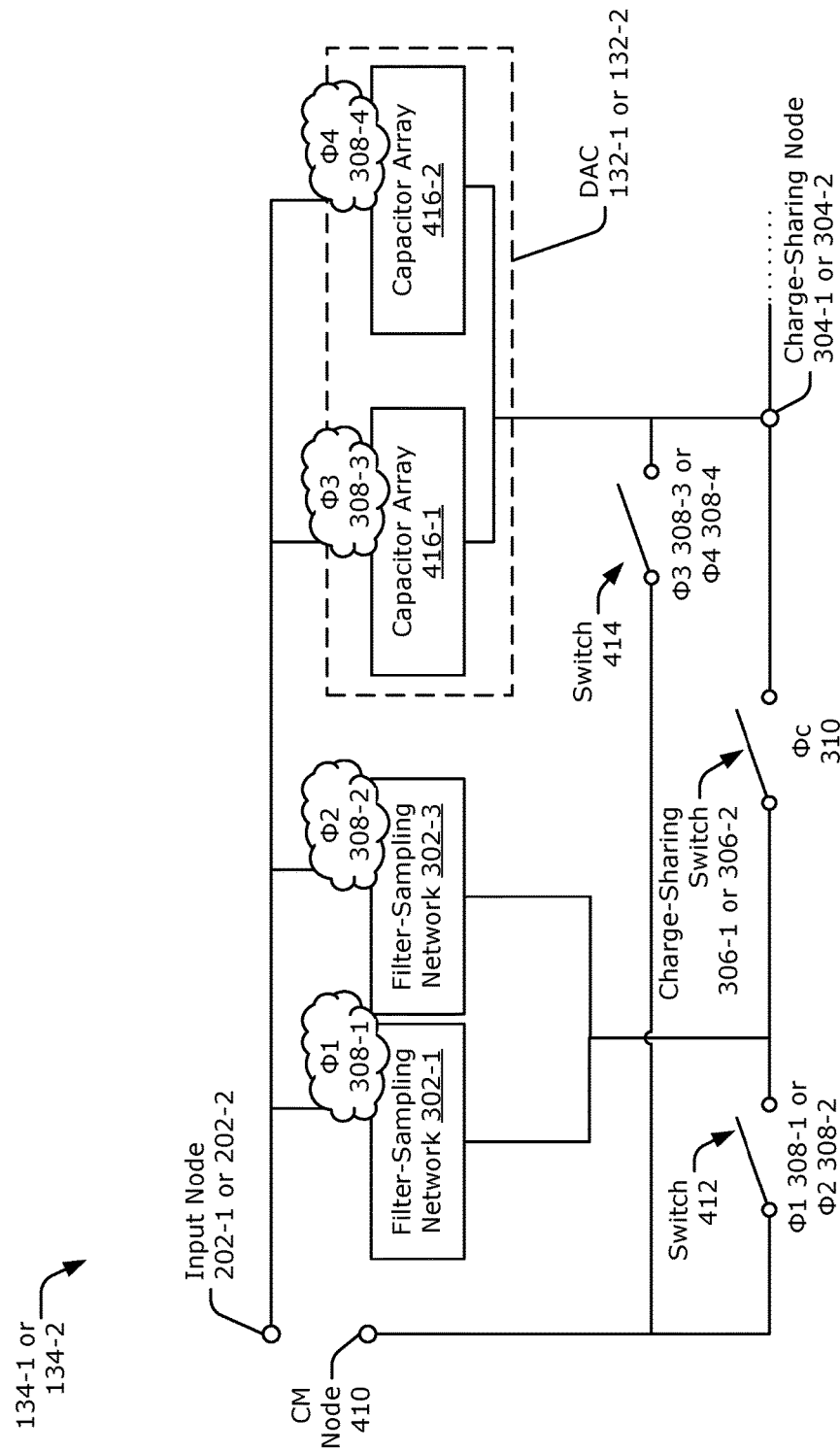
FIG. 6 illustrates another example implementation of a sample-and-hold circuit for alias rejection through charge sharing.

FIG. 6 illustrates another example implementation of a sample-and-hold circuit 134 for alias rejection through charge sharing. In the depicted configuration, the sample-and-hold circuit 134 includes two filter-sampling networks 302-1 and 302-3 and two capacitor arrays 416-1 and 416-2 within the digital-to-analog converter 132-1 or 132-2. In some cases, one of the capacitor arrays 416-1 or 416-2 can provide differential offset cancellation during the conversion phase. For example, the capacitor array 416-2 can offset the voltage at either of the charge-sharing nodes 304-1 and 304-2 by a pre-determined amount to account for a known offset between the two charge-sharing nodes 304-1 and 304-2.

To enable more than two samples to be collected, four sampling phase signals 308-1, 308-2, 308-3, and 308-4 respectively cause the filter-sampling network 302-1, the filter-sampling network 302-3, the capacitor array 416-1, and the capacitor array 416-2 to sample the analog signal 206 at different times. In this case, four samples are collected and averaged during the overall sampling period 504 of the analog-to-digital converter, as shown in FIG. 7.

FIG. 7 illustrates another set of example timing signals for alias rejection through charge sharing. Similar to FIG. 5, the sampling-phase signals 308-1, 308-2, 308-3, and 308-4 collect four samples of the analog signal 206 at different times. Afterwards, the charge-sharing phase signal 310 causes these samples to be averaged at the charge-sharing node 304. As shown in FIG. 7, the sampling-phase signals 308-1 and 308-2, which correspond to the filter-sampling networks 302-1 and 302-3, can occur while the analog-to-digital converter 126 converts a previously-collected average sample.

The sampling times indicated in FIG. 7 can also be varied such that the overall sampling period 504 is spread evenly or unevenly across the different sampling times. In other words, the sampling times can occur at consistent intervals across the overall sampling period 604 (e.g., at half-period intervals or at quarter-period intervals) or at inconsistent intervals (e.g., one sample at half of the period, another sample at a third of the period, or an additional sample at a sixteenth of the period). This provides additional degrees of freedom in tuning the response 214 of the analog-to-digital converter 126 (of FIG. 2). A quantity and timing of these sampling-phase signals 308 can also be dynamically adjusted via the filter-tuning signal 210. For example, the filter-tuning signal 210 can cause a different number of filter-sampling networks to be activated in order to attenuate different jammers. Through charge sharing, alias rejection can be achieved without significantly impacting communication signals (e.g., lower-frequency signals), as further described with respect to FIGS. 8 and 9.

Figure 8:
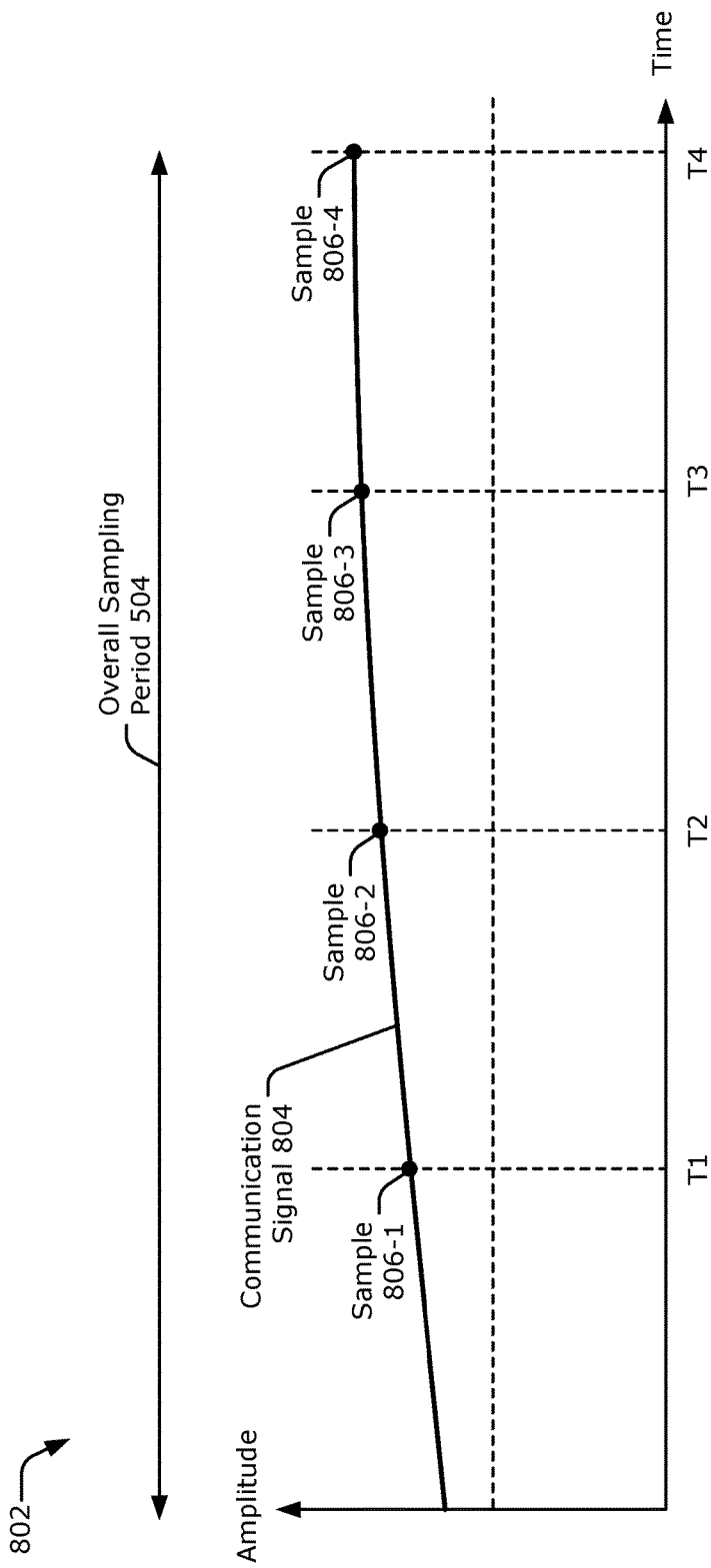
FIG. 8 illustrates an example communication signal for alias rejection through charge sharing.

FIG. 8 illustrates an example communication signal 804 for alias rejection through charge sharing. A graph 802 depicts an amplitude of the communication signal 804 across the overall sampling period 504. In this example, the communication signal 804 includes a low-frequency signal, such as a downlink signal. The communication signal 804 has a frequency that is significantly less than the overall sampling frequency of the analog-to-digital converter 126. In this case, the sample-and-hold circuit 134 is configured to store four samples 806-1, 806-2, 806-3, and 806-4, an example implementation of which is shown in FIG. 6. The four samples are respectively collected at times T1, T2, T3, and T4. Because the communication signal 804 has a relatively low frequency compared to the effective sampling rate of the sample-and-hold circuit 134, an amplitude of the communication signal 804 remains relatively consistent across the multiple samples 806. As such, the average sample produced from the charge sharing is relatively close to each of the individual samples 806. In this way, the sampling of the communication signal 804 is generally unaffected.

Figure 9:
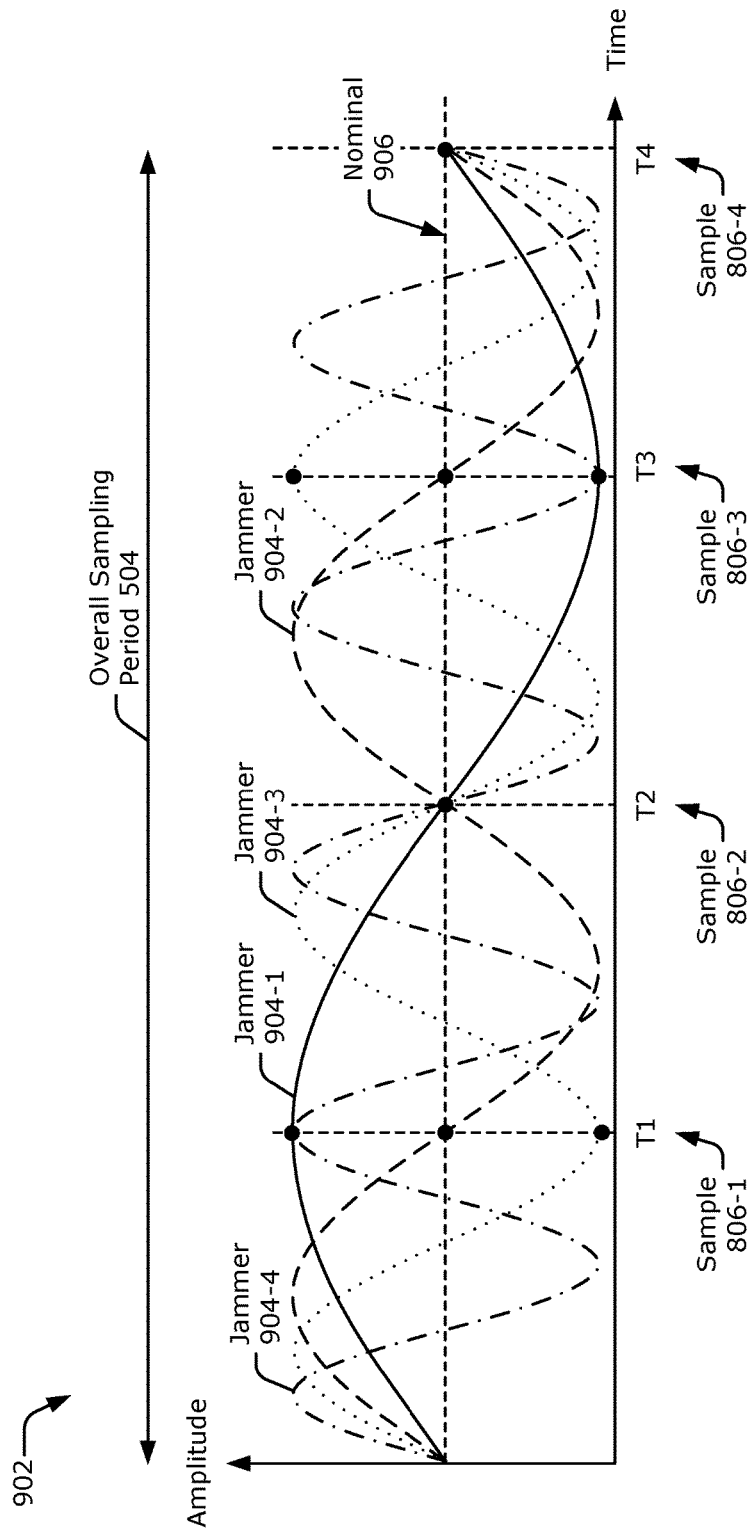
FIG. 9 illustrates example jammers for alias rejection through charge sharing.

FIG. 9 illustrates example jammers 904-1 to 904-4 for alias rejection through charge sharing. A graph 902 depicts an amplitude of the jammers 904-1 to 904-4 across the overall sampling period 504. In this example, the jammers 904-1 to 904-4 are high-frequency signals, that have frequencies greater than or equal to the overall sampling frequency of the analog-to-digital converter 126. In this case, the jammers 904-1 to 904-4 have respective frequencies equal to the overall sampling frequency, twice the overall sampling frequency, three times the overall sampling frequency, and five times the overall sampling frequency.

The sample-and-hold circuit 134 is setup to collect the four samples 806-1, 806-2, 806-3, and 806-4 at respective times T1, T2, T3, and T4. When these samples 806 are shared during the charge-sharing operation, the samples 806 effectively cancel each other. For example, the samples 806-1 and 806-3 of jammer 904-1 are equal and opposite each other, thereby enabling the jammer 904-1 to be rejected. As another example, the samples 806-2 and 806-4 occur at a nominal amplitude 906, which shows up as a DC tone. These concepts can be applied to the other jammers 904-2 to 904-4.

Although the communication signal 804 and the jammers 904 are described as separate signals in FIGS. 8 and 9, the analog signal 206 can include one or both of these signals. The techniques for alias rejection through charge sharing thus enable the analog-to-digital converter 126 to filter (e.g., attenuate) the jammers 904 without significantly affecting the communication signal 804.

Figure 10:
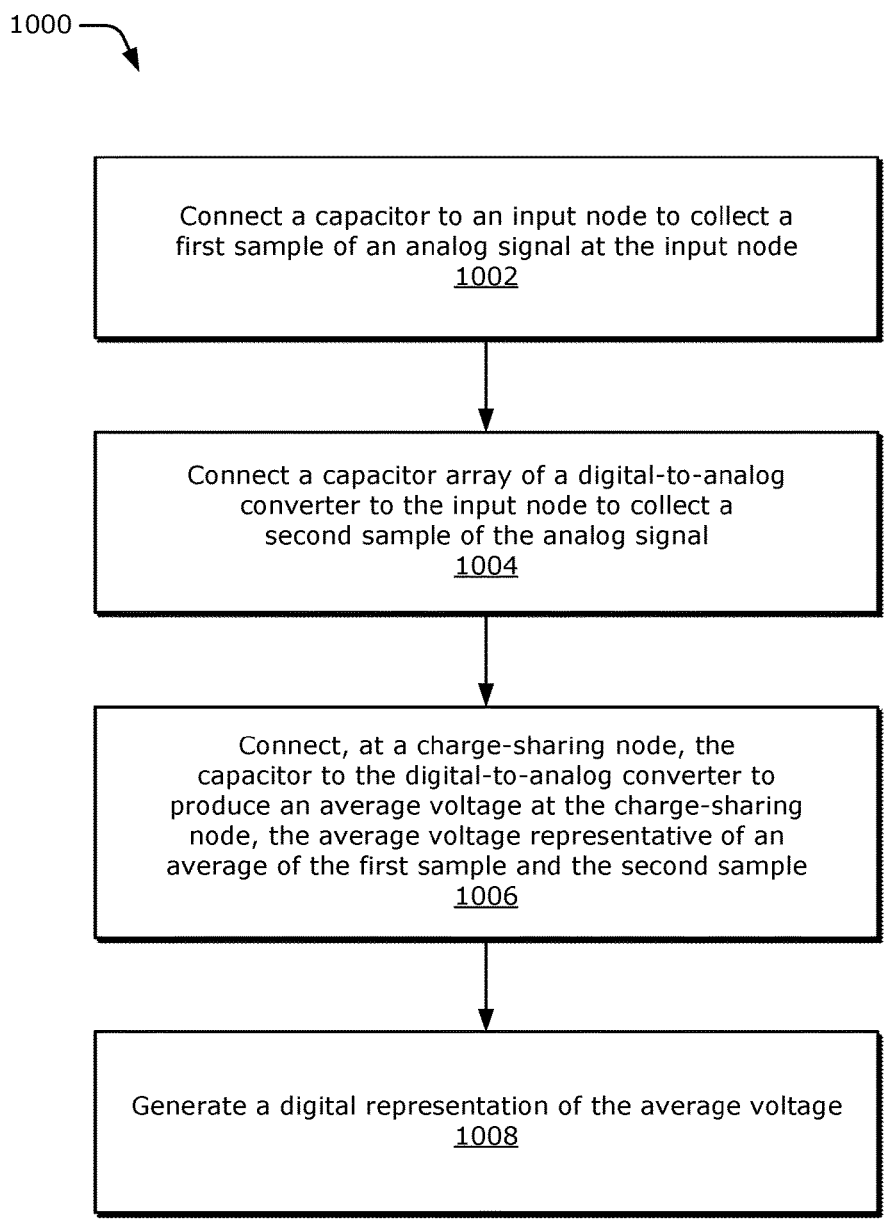
FIG. 10 illustrates a flow diagram illustrating an example process for alias rejection through charge sharing.

FIG. 10 is a flow diagram illustrating an example process 1000 for alias rejection through charge sharing. The process 1000 is described in the form of a set of blocks 1002-1008 that specify operations that can be performed. However, operations are not necessarily limited to the order shown in FIG. 10 or described herein, for the operations may be implemented in alternative orders or in fully or partially overlapping manners. Operations represented by the illustrated blocks of the process 1000 may be performed by an analog-to-digital converter 126 (e.g., of FIG. 1 or 2) or a sample-and-hold circuit 134 (e.g., of FIG. 1, 3, 4 or 6). More specifically, the operations of the process 1000 may be performed by a filter-sampling network 302, a digital-to-analog converter capacitor array 614, and a charge-sharing switch 306, as shown in FIG. 3, 4-1, 4-2, or 6.

At block 1002, a capacitor is connected to an input node to collect a first sample of an analog signal at the input node. For example, the capacitor 402 of the filter-sampling network 302-1 or 302-2 is connected to the input node 202-1 or 202-2 via the switch 408-1, as shown in FIG. 4-1. A timing of this connection is based on the first sampling-phase signal 308-1, which causes the filter-sampling network 302 to collect a first sample of the analog signal 206.

At block 1004, a capacitor array of a digital-to-analog converter is connected to the input node to collect a second sample of the analog signal. For example, the capacitor array 416 of the digital-to-analog converter 132-1 or 132-2 is connected to the input node 202, as shown in FIG. 4-2. A timing of this connection is based on the second sampling-phase signal 308-2, which causes the digital-to-analog converter 132 to collect a second sample of the analog signal 206.

At block 1006, the capacitor is connected to the digital-to-analog converter at a charge-sharing node to produce an average voltage at the charge-sharing node. The average voltage is representative of an average of the first sample and the second sample. For example, the charge-sharing switch 306-1 or 306-2 of FIG. 3 connects the filter-sampling network 302 to the digital-to-analog converter 132-1 or 132-2 at the charge-sharing node 304-1 or 304-2. A timing of this connection is based on the charge-sharing phase signal 310, which causes the charge on the capacitor 402 and the capacitor array 416 to be shared. Due to the charge sharing, an average voltage at the charge-sharing node 304 is representative of an average of the first sample and the second sample. In some cases, the average voltage is representative of a weighted average.

At block 1008, a digital representation of the average voltage is generated. For example, an N-bit binary number, which represents a digital sample of the digital signal 208, can be generated via the successive approximation register 128. In particular, the comparator 130, the successive approximation register 128, and the digital-to-analog converter 132 can jointly perform a binary search to digitally approximate the average sample. A timing of the binary search is performed based on the conversion-phase signal 312.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
an input node;
a charge-sharing node;
a filter-sampling network including a capacitor and a first switch, the first switch coupled between the input node and the capacitor, the filter-sampling network configured to connect or disconnect the capacitor to or from the input node via the first switch;
a digital-to-analog converter including a capacitor array and a second switch, the second switch coupled between the input node and the capacitor array, the capacitor array coupled between the second switch and the charge-sharing node, the digital-to-analog converter configured to connect or disconnect the capacitor array to or from the input node via the second switch; and
a charge-sharing switch coupled between the charge-sharing node and the capacitor, the charge-sharing switch configured to connect or disconnect the capacitor to or from the digital-to-analog converter.

2. The apparatus of claim 1, wherein:
the input node is configured to accept an analog signal;
the filter-sampling network is configured to sample, based on a connection of the capacitor to the input node via the first switch, a first voltage of the analog signal using the capacitor, the first voltage representative of a first sample of the analog signal;
the digital-to-analog converter is configured to sample, based on a connection of the capacitor array to the input node via the second switch, a second voltage of the analog signal using the capacitor array, the second voltage representative of a second sample of the analog signal; and
the charge-sharing switch is configured to produce, based on a connection of the capacitor to the capacitor array, an average voltage at the charge-sharing node, the average voltage representative of an average of the first sample and the second sample.

3. The apparatus of claim 2, wherein the filter-sampling network, the digital-to-analog converter, and the charge-sharing switch are configured to jointly provide alias rejection at the charge-sharing node based on the average voltage.

4. The apparatus of claim 2, wherein the analog signal comprises one signal of a pair of differential analog signals.

5. The apparatus of claim 2, wherein:
a capacitance of the capacitor differs from another capacitance of the capacitor array; and
the charge-sharing switch is configured to produce, based on the connection of the capacitor to the capacitor array, a weighted-average voltage as the average voltage at the charge-sharing node, the weighted-average voltage representative of a weighted average of the first sample and the second sample based on the capacitance of the capacitor and the other capacitance of the capacitor array.

6. The apparatus of claim 1, further comprising a processor coupled to the filter-sampling network, wherein:
the capacitor comprises a programmable capacitor; and
the processor is configured to adjust a capacitance of the programmable capacitor.

7. The apparatus of claim 1, further comprising:
a comparator coupled to the charge-sharing node; and
a successive approximation register coupled between the comparator and the digital-to-analog converter, wherein:
the digital-to-analog converter, the comparator, and the successive approximation register are jointly configured to:
perform a binary search to approximate an average voltage at the charge-sharing node; and
produce, based on the binary search, a binary number that is representative of the average voltage at the charge-sharing node.

8. The apparatus of claim 7, wherein:
the digital-to-analog converter, the comparator, and the successive approximation register are jointly configured to perform the binary search based on a conversion-phase signal; and
the filter-sampling network is configured to connect the capacitor to the input node via the first switch during a portion of time that the conversion-phase signal is indicative of the binary search being performed on a previous average voltage.

9. The apparatus of claim 7, further comprising an analog-to-digital converter, wherein:
the analog-to-digital converter includes the input node, the charge-sharing node, the filter-sampling network, the digital-to-analog converter, the charge-sharing switch, the comparator, and the successive approximation register;

the analog-to-digital converter is configured to sample an analog signal at the input node according to an overall sampling period;

the filter-sampling network is configured to connect or disconnect the capacitor to or from the input node via the first switch based on a first sampling-phase signal;

the digital-to-analog converter is configured to connect or disconnect the capacitor array to or from the input node via the second switch based on a second sampling-phase signal;

the charge-sharing switch is configured to connect or disconnect the capacitor to or from the capacitor array based on a charge-sharing phase signal; and the first sampling-phase signal, the second sampling-phase signal, and the charge-sharing phase signal respectively close the first switch, the second switch, and the charge-sharing switch at different times within the overall sampling period.

10. The apparatus of claim 1, further comprising:
another filter-sampling network, the other filter-sampling network including another capacitor and a third switch, the third switch coupled between the input node and the other capacitor, the other capacitor coupled between the third switch and the charge-sharing switch, the filter-sampling network configured to connect or disconnect the other capacitor to or from the input node via the third switch; and the charge-sharing switch is configured to connect or disconnect both the capacitor and the other capacitor to or from the capacitor array.

11. The apparatus of claim 1, wherein:
the digital-to-analog converter includes another capacitor array and a third switch, the third switch coupled between the input node and the other capacitor array, the other capacitor array coupled between the third switch and the charge-sharing node, the digital-to-analog converter configured to connect or disconnect the other capacitor array to or from the input node via the third switch; and the charge-sharing switch is configured to connect or disconnect the capacitor to or from both the capacitor array and the other capacitor array.

12. The apparatus of claim 1, wherein:
the first switch is coupled to a bottom plate of the capacitor;

the second switch comprises multiple switches that are respectively coupled to bottom plates of multiple capacitors of the capacitor array;

the charge-sharing node is coupled to top plates of the multiple capacitors of the capacitor array; and the charge-sharing switch is coupled between a top plate of the capacitor and the charge-sharing node.

13. The apparatus of claim 1, wherein:
the first switch is coupled to a top plate of the capacitor;
the second switch comprises multiple switches that are respectively coupled to top plates of multiple capacitors of the capacitor array;

the charge-sharing node is coupled to bottom plates of the multiple capacitors of the capacitor array; and the charge-sharing switch is coupled between a bottom plate of the capacitor and the charge-sharing node.

14. An apparatus comprising:
an input node configured to accept an analog signal;
a charge-sharing node;

filter-sampling means for collecting one or more samples of the analog signal, the filter-sampling means coupled to the input node;

a digital-to-analog converter including a capacitor array and a switch, the switch coupled between the input node and the capacitor array, the capacitor array coupled between the switch and the charge-sharing node, the digital-to-analog converter configured to collect, via the capacitor array and the switch, another sample of the analog signal; and charge-sharing means for averaging multiple samples, the charge-sharing means coupled between the charge-sharing node and the filter-sampling means, the charge-sharing means configured to produce, at the charge-sharing node, an average sample of the analog signal based on the one or more samples and the other sample.

15. The apparatus of claim 14, wherein the filter-sampling means comprises:

capacitive means for storing the one or more samples; and
switch means for connecting or disconnecting the capacitive means to or from the input node.

16. The apparatus of claim 15, further comprising a processor coupled to the capacitive means, the processor configured to adjust a capacitance of the capacitive means based on a specified frequency of a jammer to cause the jammer to be attenuated at the charge-sharing node.

17. The apparatus of claim 15, wherein:
the capacitive means comprises weighted means for storing the one or more samples with one or more weights to collect one or more weighted samples;

the digital-to-analog converter is configured to store the other sample with another weight to collect another weighted sample, the other weight and the one or more weights comprising at least two different weights; and the charge-sharing means is configured to produce, at the charge-sharing node, a weighted-average sample of the analog signal based on the one or more weighted samples and the other weighted sample.

18. The apparatus of claim 14, wherein:
the filter-sampling means is configured to collect the one or more samples of the analog signal based on one or more sampling-phase signals;

the digital-to-analog converter is configured to collect the other sample of the analog signal based on another sampling-phase signal;

the charge-sharing means is configured to connect the filter-sampling means to the charge-sharing node based on a charge-sharing phase signal;

the one or more sampling-phase signals and the other sampling-phase signal are indicative of the one or more samples and the other sample being collected at different times; and the charge-sharing phase signal is indicative of the average sample being produced after the one or more samples and the other sample are collected.

19. The apparatus of claim 14, further comprising:
a comparator coupled to the charge-sharing node; and
a successive approximation register coupled between the comparator and the digital-to-analog converter, wherein the digital-to-analog converter, the comparator, and the successive approximation register are jointly configured to:

perform a binary search to approximate the average sample at the charge-sharing node; and produce, based on the binary search, a binary number that is representative of the average sample at the charge-sharing node.

20. The apparatus of claim 19, wherein the filter-sampling means is configured to produce the one or more samples during a portion of time that the binary search is performed on a previous average sample.

21. A method for alias rejection through charge sharing, the method comprising:
connecting a capacitor to an input node to collect a first sample of an analog signal at the input node;
connecting a capacitor array of a digital-to-analog converter to the input node to collect a second sample of the analog signal;
connecting, at a charge-sharing node, the capacitor to the digital-to-analog converter to produce an average voltage at the charge-sharing node, the average voltage representative of an average of the first sample and the second sample; and
generating a digital representation of the average voltage.

22. The method of claim 21, further comprising connecting another capacitor to the input node to collect a third sample of the analog signal,
wherein the connecting of the capacitor and the connecting of the digital-to-analog converter further comprise connecting the capacitor, the digital-to-analog converter, and the other capacitor together to produce the average voltage at the charge-sharing node, the average voltage representative of an average of the first sample, the second sample, and the third sample.

23. The method of claim 22, further comprising:
connecting another capacitor array of the digital-to-analog converter to the input node to collect a fourth sample of the analog signal; and
producing the average voltage at the charge-sharing node based on the connecting of the capacitor, the digital-to-analog converter, and the other capacitor together, the average voltage representative of an average of the first sample, the second sample, the third sample, and the fourth sample.

24. The method of claim 21, further comprising performing a binary search on a previous average voltage at the charge-sharing node,
wherein the connecting of the capacitor to the input node occurs during a portion of time that the binary search is performed.

25. The method of claim 21, wherein the average voltage is representative of a weighted average of the first sample and the second sample.

26. An apparatus comprising:
an input node;
a charge-sharing node;
a comparator including an input and an output, the input of the comparator coupled to the charge-sharing node;
a successive approximation register coupled to the output of the comparator;
a filter-sampling network including a capacitor and a first switch, the first switch coupled between the input node and the capacitor, the filter-sampling network configured to connect or disconnect the capacitor to or from the input node via the first switch based on a first sampling-phase signal;
a digital-to-analog converter coupled to the successive approximation register, the digital-to-analog converter including a capacitor array and a second switch, the second switch coupled between the input node and the capacitor array, the capacitor array coupled between the second switch and the charge-sharing node, the digital-to-analog converter configured to connect or disconnect the capacitor array to or from the input node via the second switch based on a second sampling-phase signal; and
a charge-sharing switch coupled between the charge-sharing node and the capacitor, the charge-sharing switch configured to connect or disconnect the capacitor to or from the digital-to-analog converter based on a charge-sharing phase signal.

27. The apparatus of claim 26, further comprising:
another input node;
another charge-sharing node; and
another charge-sharing switch, wherein:
the comparator includes another input coupled to the other charge-sharing node;
the filter-sampling network includes another capacitor and a third switch, the third switch coupled between the other input node and the other capacitor, the other capacitor coupled between the third switch and the other charge-sharing switch, the filter-sampling network configured to connect or disconnect the other capacitor to or from the other input node via the third switch based on the first sampling-phase signal;
the digital-to-analog converter includes another capacitor array and a fourth switch, the fourth switch coupled between the other input node and the other capacitor array, the other capacitor array coupled between the fourth switch and the other charge-sharing node, the digital-to-analog converter configured to connect or disconnect the other capacitor array to or from the other input node via the fourth switch based on the second sampling-phase signal; and
the other charge-sharing switch is coupled between the other charge-sharing node and the other capacitor, the other charge-sharing switch configured to connect or disconnect the other capacitor to or from the digital-to-analog converter based on the charge-sharing phase signal.

28. The apparatus of claim 26, further comprising a processor, wherein:
the charge-sharing switch is configured to produce, based on a connection of the capacitor to the digital-to-analog converter, an average voltage at the charge-sharing node;
the successive approximation register is configured to generate a discrete voltage representative of the average voltage at the charge-sharing node; and
the processor is configured to accept the discrete voltage.

29. The apparatus of claim 28, wherein:
a capacitance of the capacitor differs from another capacitance of the capacitor array; and
the charge-sharing switch is configured to produce, based on the connection of the capacitor to the digital-to-analog converter, a weighted-average voltage as the average voltage at the charge-sharing node based on the capacitance and the other capacitance.

30. The apparatus of claim 26, wherein:
the filter-sampling network, the digital-to-analog converter, and the charge-sharing switch are jointly configured to implement a two-tap finite impulse response filter; and
a coefficient of the two-tap finite impulse response filter is based on a capacitance of the capacitor.

* * * * *